United States Patent [19]

Kaufmann

[11] Patent Number: 5,414,732
[45] Date of Patent: May 9, 1995

[54] ADAPTIVE EQUALIZER AND METHOD FOR OPERATION AT HIGH SYMBOL RATES

[75] Inventor: John Kaufmann, Palo Alto, Calif.

[73] Assignee: Loral Aerospace Corp., New York, N.Y.

[21] Appl. No.: 61,958

[22] Filed: May 17, 1993

[51] Int. Cl.$^6$ .......................... H03H 7/30; H03H 7/40
[52] U.S. Cl. ................................ 375/232; 364/724.19; 364/724.2; 375/229; 375/230; 375/231; 375/235
[58] Field of Search ...................... 375/11–15, 375/106; 333/18, 28 R; 364/724.19, 724.2

[56] References Cited

U.S. PATENT DOCUMENTS 4,635,276  1/1987  Karabinis .................. 375/15

Primary Examiner—Stephen Chin
Assistant Examiner—Huong Luu
Attorney, Agent, or Firm—Kenneth W. Float; Anthony W. Karambelas

[57] ABSTRACT

Adaptive equalizers and processing methods wherein data required to implement an adaptation algorithm is sampled at a rate that is significantly lower than the symbol rate. The adaptation algorithm is processed at this reduced rate, in that updated tap coefficients, sample timing errors and symbol clock error signals are computed at this reduced rate. An advantage of the adaptive equalizer and processing method of the present invention is that the adaptation algorithm may be implemented in equipment that operates at a clock rate that is much less then the symbol rate. In particular, the adaptation algorithm may be computed using software that is resident in inexpensive general purpose digital processor, such as a personal computer, for example. A benefit of the adaptive equalizer and processing method of the present invention is that more sophisticated and more effective adaptation algorithms are practical when compared to adaptive equalizers using algorithms that are constrained to operate at higher symbol rates.

8 Claims, 6 Drawing Sheets

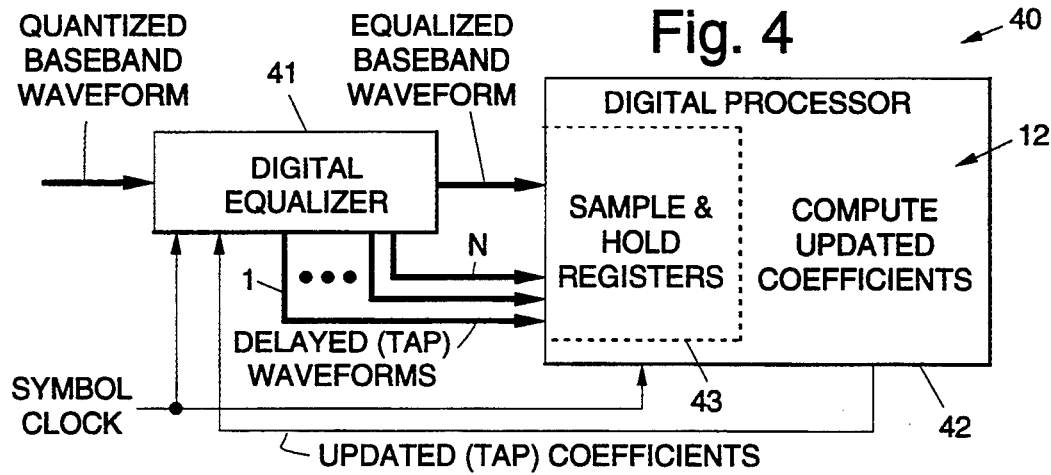
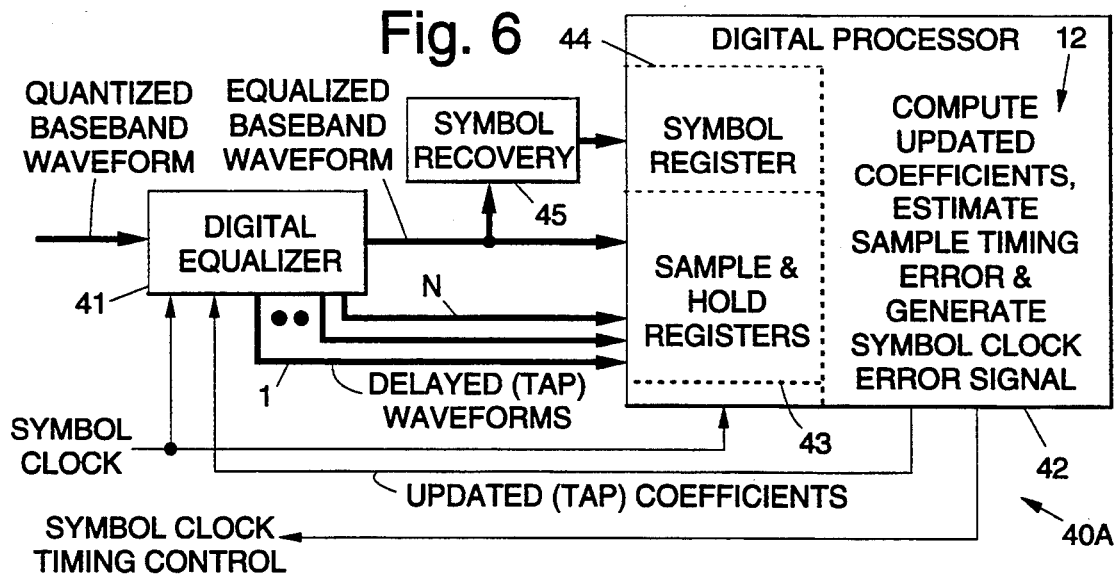
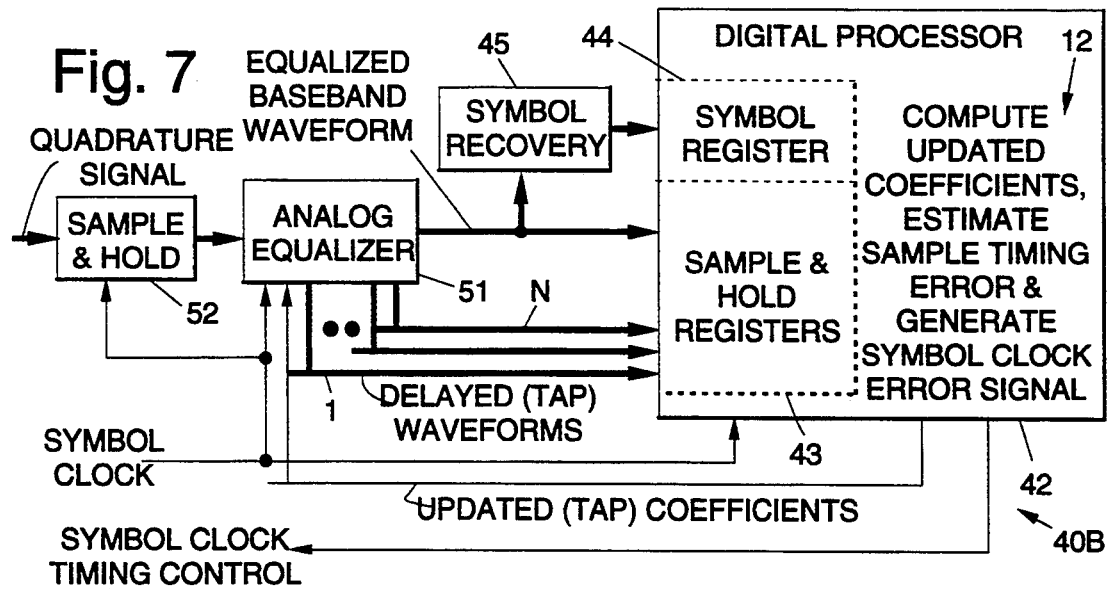

ADAPTIVE EQUALIZER AND METHOD FOR OPERATION AT HIGH SYMBOL RATES

BACKGROUND

The present invention relates generally to adaptive equalizers, and more particularly, to adaptive equalizers and processing methods that provide for adaptive equalization at very high data symbol rates.

A well-known technique for minimizing the effect of intersymbol interference is to "equalize" digitally modulated signals. Intersymbol interference is generated as a result of non-ideal phase and frequency characteristics of a transmitter, a receiver, and a communication channel therebetween. Such non-ideal channel characteristics result in various delays for different signal frequency components. The effect of intersymbol interference is that a particular received signal pulse will be distorted by late frequency components of previous pulses and early frequency components of successive pulses.

An equalizer receives some number of earlier pulses, a current pulse, and some number of later pulses. In an ideal situation, by suitably adding and subtracting suitably scaled received pulses to and from the current pulse, the effect of intersymbol interference at a particular sample time of a received pulse can be totally removed. In practical applications of this idea, the equalizer is designed to adapt to the phenomena that causes the intersymbol interference. The benefits of such an adaptive equalizer is that it is not necessary to model the entire communication chain, since it adapts to both fixed and time varying parameters, and in particular to the effect of a changing dispersive communication channel.

U.S. Pat. No. 4,759,037 issued to Debus, Jr. et al., describes an adaptive equalization technique for equalizing an incoming signal including quadrature-related carder signals by forming the product of the incoming signal at at least one prescribed time and only one real-valued coefficient associated with each time. In one embodiment the equalized incoming signal is demodulated into a first pair of component signals. At least one of these component signals is then used to generate each coefficient. In another embodiment each coefficient is generated in response to at least one of the component signals in the first pair along with a second pair or component signals which are formed by demodulating the incoming signals.

SUMMARY OF THE INVENTION

The present invention provides for an adaptive equalizer and processing method wherein data that is required to implement an adaptation algorithm is sampled at a rate that is significantly lower than the symbol rate. The adaptation algorithm is processed at this reduced rate, in that updated tap coefficients, sample timing errors and symbol clock error signals are computed at this reduced rate.

More particularly, the present invention is an adaptive equalizer system for processing an input signal and producing an equalized output signal. The equalizer system comprises an equalizer for receiving the input signal and for producing an equalized output signal and tap coefficients that are generated at a predetermined symbol clock rate. A digital processor is coupled to the equalizer that comprises sample and hold registers for sampling and holding the equalized output signal and tap coefficients, for computing updated tap coefficients using the sampled and held output signal and tap coefficients at a predetermined sample clock rate that is substantially less that the symbol clock rate, and for feeding back the updated tap coefficients to the equalizer.

The present invention also comprises a processing method that provides for adaptive equalization of an input signal. The method comprises the following steps. Receiving an input signal. The input signal is a quantized baseband waveform in a digital equalizer implementation, or a quadrature signal in an analog equalizer implementation. Applying the input signal to an equalizer. In the analog implementation, the quadrature signal is sampled and held prior to being applied to the analog equalizer. Producing an equalized output signal and tap coefficients that are generated at a predetermined symbol clock rate. Sampling and holding the equalized output signal and delayed tap signals. Computing updated tap coefficients using the sampled and held signals at a predetermined sample clock rate that is substantially less that the symbol clock rate. Feeding back the updated tap coefficients to the equalizer.

An advantage of the adaptive equalizer and processing method of the present invention is that the adaptation algorithm may be implemented in equipment that operates at a clock rate that is much less then the symbol rate. In particular, the adaptation algorithm may be computed using software that is resident in inexpensive general purpose digital processor, such as a personal computer, for example. A benefit of the adaptive equalizer and processing method of the present invention is that more sophisticated and more effective adaptation algorithms are practical when compared to adaptive equalizers using algorithms that are constrained to operate at higher symbol rates.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 4 illustrates a first embodiment of a sampled adaptive equalizer in accordance with the principles of the present invention;

FIG. 6 illustrates a second embodiment of a sampled adaptive equalizer in accordance with the principles of the present invention;

FIG. 7 illustrates a third embodiment of a sampled adaptive equalizer in accordance with the principles of the present invention.

DETAILED DESCRIPTION

Figure 1:
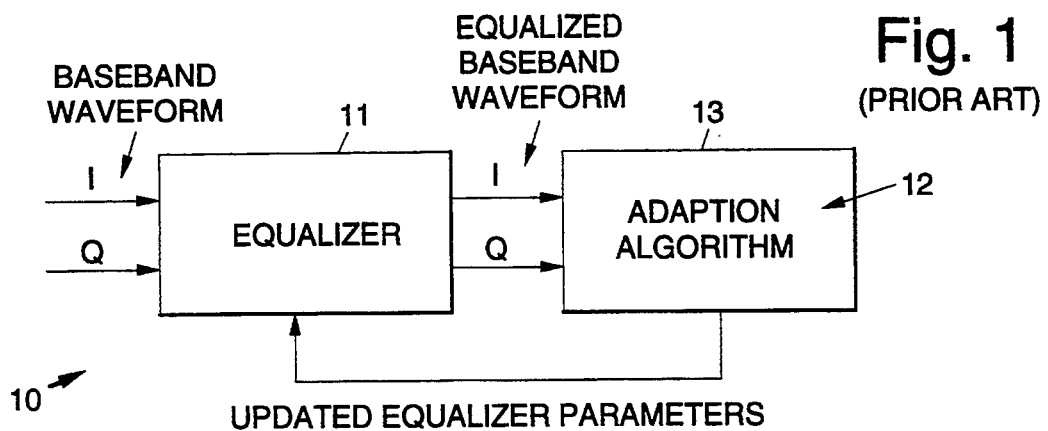
FIG. 1 illustrates a conventional adaptive baseband equalizer.

Equalizers that are applied after demodulation are known as adaptive baseband equalizers. Referring to the drawing figures, FIG. 1 illustrates a conventional adaptive baseband equalizer 10. The conventional adaptive baseband equalizer 10 is comprised of an equalizer 11 and a processor 13 comprising circuitry, firmware, or software that implements an adaptation algorithm 12. The adaptation algorithm 12 generally implements a procedure that generates an estimate of an ideal received baseband waveform, compares the estimate against an equalized baseband waveform, and using the results of the comparison, computes new equalizer (tap) parameters that are fed back to the equalizer 11. Conventional adaptive equalizers 10 implement the computations for the adaptation algorithm 12 at a predetermined symbol clock rate.

Figure 2:
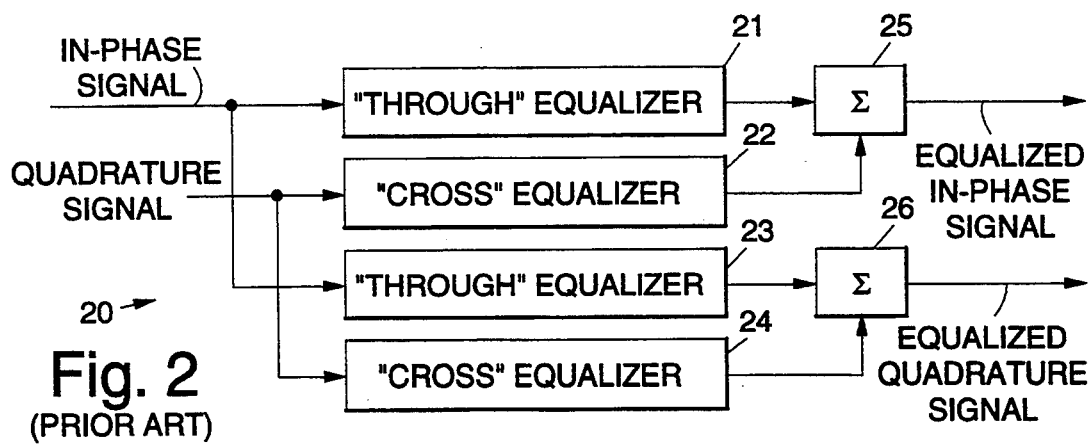
FIG. 2 illustrates circuitry employed with the equalizer of FIG. 1 that is adapted to produce in-phase and quadrature signals.

The equalizer 11 of FIG. 1 is adapted to process in-phase and quadrature signals. Referring to FIG. 2, it illustrates conventional circuitry 20 that generates the in-phase and quadrature signals that are inputs to the equalizer 11 of FIG. 1. The circuitry 20 is comprised of two pairs of "through" and "cross" transversal filters 21, 23, 22, 24 that are coupled to summing devices 25, 26 in the manner shown in FIG. 2. The output of the circuitry 20 are the equalized in-phase and quadrature signals that comprise the baseband waveform that is applied to the equalizer 11 of FIG. 1.

Figure 3:
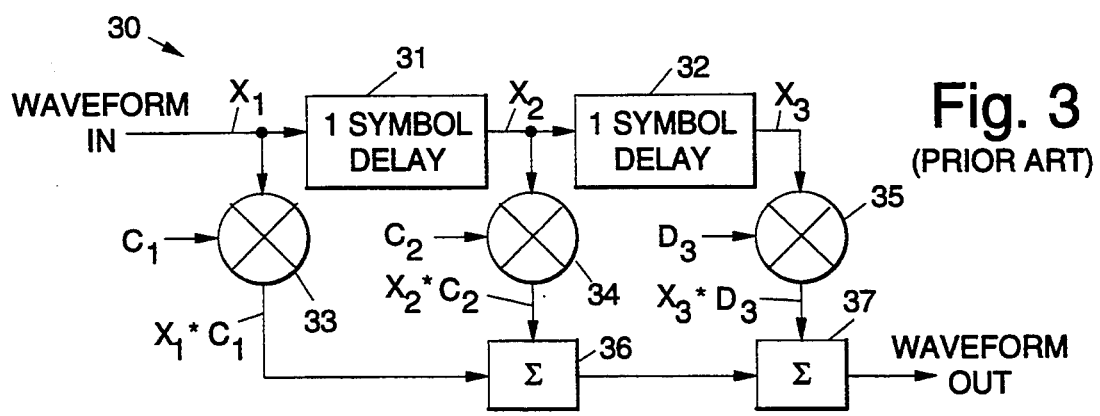
FIG. 3 illustrates a conventional three tap FIR filter.

Each of the transversal filters 21, 22, 23, 24 are similar to a conventional FIR filter 30 illustrated in FIG. 3. In particular, FIG. 3 illustrates a conventional three tap FIR filter 30 employed in each of the transversal filters 21, 22, 23, 24 of the circuitry 20 shown in FIG. 2. The FIR filter 30 is comprised of first and second serially coupled one-symbol delay circuits 31, 32, three multipliers 33, 34, 35, and two summing circuits 36, 37, coupled together in the manner illustrated in FIG. 3. The design and construction of the FIR filter 30 of FIG. 3 is well-known and further details thereof will not be described herein.

Referring to FIG. 4, it illustrates a first embodiment of a sampled adaptive equalizer 40 in accordance with the principles of the present invention. The present invention comprises an adaptive baseband equalizer 40 that is adapted to operate at an extremely high symbol rate. In the digital implementation shown in FIG. 4, the inputs to the equalizer 41 are quantized representations of in-phase and quadrature signals. In order to provide for an equalizer 40 that operates at a very high symbol rate, it is necessary to recognize that the rate of change in equalizer parameters is expected to be very slow, and therefore the update rate may be orders of magnitude slower than the data symbol rate. This assumes that initial parameters are preset, or a known training sequence is used to establish the initial parameters.

The adaptive baseband equalizer 40 illustrated in FIG. 4 is comprised of a digital equalizer 41 with N taps and a digital processor 42 that implements the adaptation algorithm 12. The digital processor 42 that performs the adaptation algorithm 12 is operated at a clock rate that is slower then the data symbol rate by sampling and holding I and Q signals at each of the tap positions. The sample and hold operation is achieved by using a plurality of sample and hold registers 43 at the input to the digital processor 42. This is described in more detail below.

The bold arrows in FIG. 4 represent quantized in-phase (I) and quadrature (Q) waveforms. The essence of the present invention is (for the N tap equalizer 41) to sample and hold the quantized in-phase (I) and quadrature (Q) waveform at N successive symbol clock ticks.

The sampled and held signals contain all the information that is necessary to compute the desired equalizer tap parameters (updated tap coefficients). The equalized baseband input to the digital processor 42 is not absolutely essential, since this waveform may be computed from known tap weights and the sampled and delayed baseband waveform. An advantage of using the actual equalized waveform is that it may be somewhat distorted due to implementation imperfections when compared to an ideal waveform that is the result of floating point computations.

The primary advantage of using the present invention is that the adaptation algorithm is performed at a rate which is within the capabilities of a simple and low cost digital processor 42, such as is provided by a personal computer, for example. A side benefit is that it is very easy to change the adaptation algorithm 12 by changing a software program or inputting parameters into a program. Furthermore the adaptation algorithm 12 may be designed to be more sophisticated when compared to conventional hardware implemented versions of the equalizer 42. In typical hardware implementations, there may be different algorithms for initial signal acquisition, tracking, and during periods of noisy signal environments, and these are generally complicated and costly to implement.

The results of the computation of the adaptation algorithm 12 are updated tap weight coefficients that are applied to the equalizer 42. The equalizer 42 typically contains a dual set of tap weight registers 38. One set of registers 38 is operative while the second set of registers 38 is loaded with new coefficients. Upon completion of an update, switching to the updated registers takes place immediately after a symbol sample pulse. Some high speed digital equalizer designs utilize multiplier lookup tables to perform the functions of the registers 38. For these situations, a dual set of multiplier lookup tables 39 are required, and the adaptation algorithm 12 generates the contents of the updated tables. Typical examples of the dual register and dual multiplication table approaches are described below with reference to FIGS. 5a and 5b.

Figure 5A:
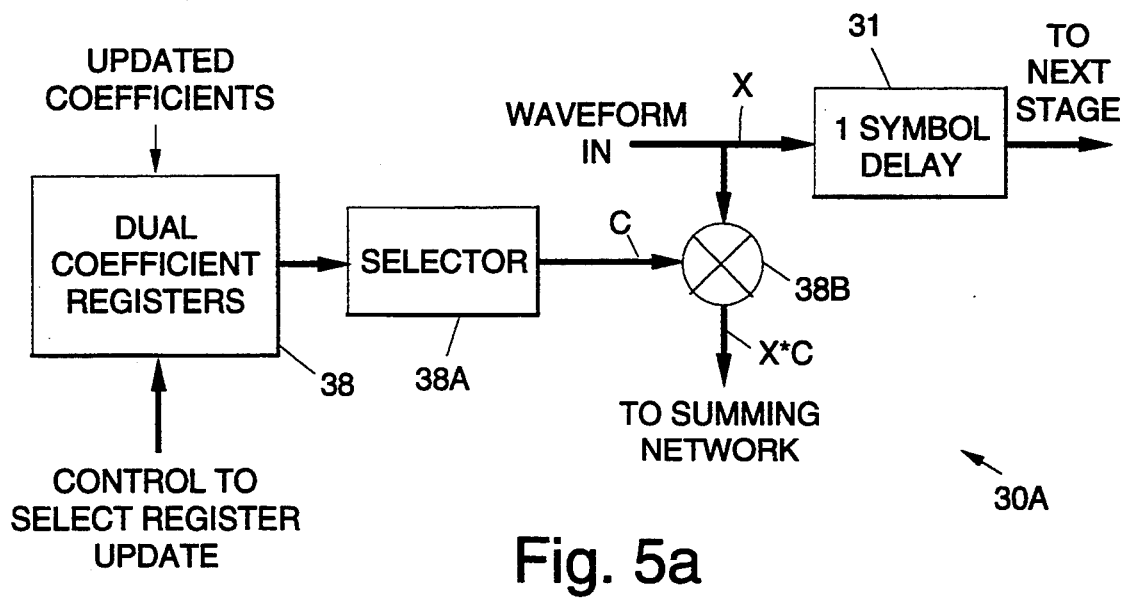
FIGS. 5a and 5b illustrate embodiments of a FIR filter having dual coefficient registers and dual multiplication tables, respectively.
Figure 5B:
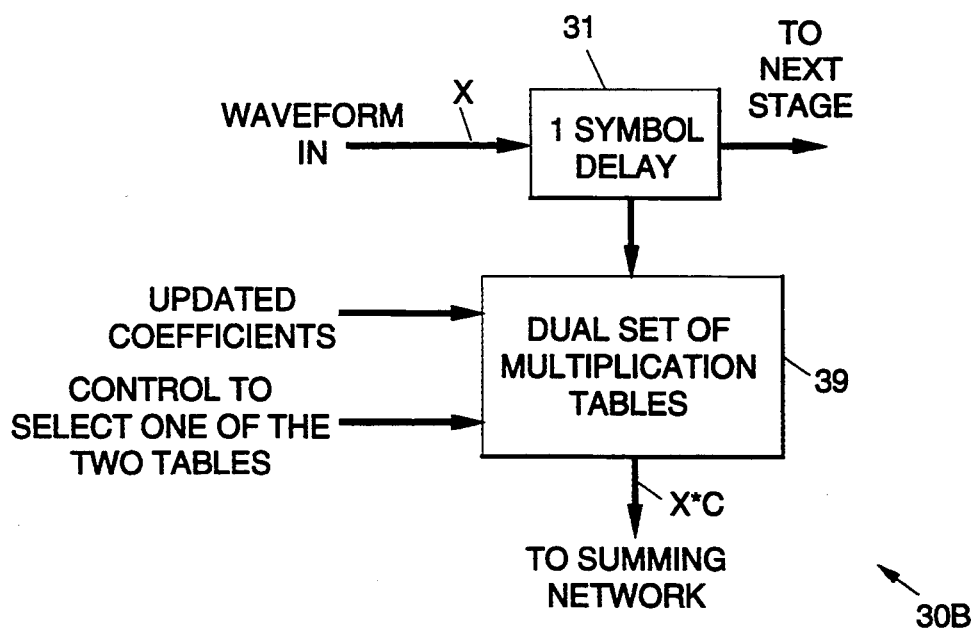

FIGS. 5a and 5b illustrate embodiments of one stage of FIR filters 30A, 30B having dual coefficient registers 38 and dual multiplication tables 39, respectively. Referring to FIG. 5a, updated coefficients are applied to the dual coefficient registers 38 whose outputs are coupled by way of a selector 38A that selects a particular register for output to a multiplier 38B. Control signals are coupled to the dual coefficient registers 38 to select register update and to the selector 38A to select one of the two register coefficients. The input waveform (X) is multiplied by an output (C) of the selector 38A to produce the quantity X*C which is applied to the summing circuit 36. The input waveform is also coupled by means of a one symbol delay 31 to the next FIR stage. Referring to FIG. 5b, the input waveform is input to a one symbol delay 31 and then to the next FIR stage. The input waveform is coupled by way of the one symbol delay 31 to the dual set of multiplication tables 39. Signals comprising updates to the multiplication tables and control signals for writing the updated coefficients into the tables and for selecting one of the tables are input to the dual set of multiplication tables 39. The input waveform (X) is multiplied by an output (C) of the multiplication tables to produce the quantity X*C which is applied to the summing circuit 36.

Another benefit of the present invention is that it is possible to derive a sample timing error signal from the information that is present in the computed tap weights. For example, consider an ideal waveform that has no intersymbol interference. The pulse response of such a waveform is a sine function. An adaptive equalizer 40 that samples in the middle of a symbol (pulse) would converge to a maximum weighted center tap coefficient, and have null weights for all other coefficients. If the equalizer is set to sample the input signal at a point other then the middle (peak), then the adaptation algorithm 12 forces its output to shift in time such that the output signal is sampled at its peak (the condition for no intersymbol interference). This shift in time is indicated by the center tap decreasing in value and the neighboring early or late taps increasing in value. In a non-ideal situation, even if the sampling is on time, the tap weights other than the center tap 11 exhibit non-zero values. However, even in the presence of non-ideal waveforms, the same phenomena is observed. One implementation of the algorithm 12 is to take the ratio of the center tap to the neighboring trailing tap and the ratio of the center tap to the neighboring early tap. Applying a threshold to these two ratios yields a signal that is used to control the timing of the symbol clock such that it triggers at an optimum sampling time.

In addition to the components described above regarding the equalizer 40 of FIG. 4, the equalizer 40A includes symbol recovery circuits 45 that process the equalized baseband waveform to derive symbols therefrom. FIG. 6 shows a second embodiment of the sampled adaptive baseband equalizer 40A of the present invention. The symbol recovery circuits 45 are coupled to a symbol register 44 in the processor 42 that is adapted to sample and hold the recovered symbols. The output of a conventional adaptive baseband equalizer is normally applied to a processor that completes the demodulation process by recovering the symbol information from the equalized quadrature waveform. In the sampled adaptive baseband equalizer 40A, by sampling the symbol signal corresponding to the signal samples in the sample and hold registers 44, the adaptation algorithm 12 does not have to perform this demodulation function.

The idea of sampling the equalizer 41 to collect the information that is required to adaptively generate updated equalizer parameters is essential in constructing a practical adaptive baseband equalizer 40A in accordance with the present invention that operates at extremely high symbol rate. Using presently available technology, the construction of a digital equalizer is primarily limited by the availability of high speed multipliers. Well-known schemes to overcome implementation problems due to high symbol rates are pipelining and the use of parallel computational paths. One or both schemes are compatible with the sampling approach used in the present invention. If parallelization of the equalizer 40A is employed, only one of the parallel equalizers needs to be sampled. This also holds true for the symbol recovery circuits 45. If quantization (A/D conversion) is not practical at some extremely high symbol rate, and high speed sample and hold registers 43 are used, then a third version of the sampled equalizer 40B may be used, as is shown in FIG. 7.

Referring to FIG. 7, the equalizer 40B utilizes analog signal processing components. A sample and hold circuit 52 captures the pertinent equalizer waveforms. The multiplier coefficients are programmable. Parallelization of the analog equalizers 51 is another design option. In this situation, a sample and hold circuit 51 is required at the input of each equalizer 52 but only one equalizer 51 requires a sample and hold circuit 43 coupled to its output.

Given that the symbol clock is phased to trigger near the middle of a symbol pulse, the aperture time requirements for the sample and hold circuits 52, 43, 44 are much less severe then would be required if it is necessary to reconstruct the analog signal. That is, for high speed quantization, the aperture time must be small enough to minimize quantization errors at maximum signal amplitude slopes. In the equalizer 40B, the aperture time requirements are commensurate with sampling at the peak of the pulse, which is at the minimum signal amplitude slope. In a steady state condition, after the equalizer 40B has adapted, the output of the equalizer 40B is guaranteed to be sampled at such a condition.

Figure 8:
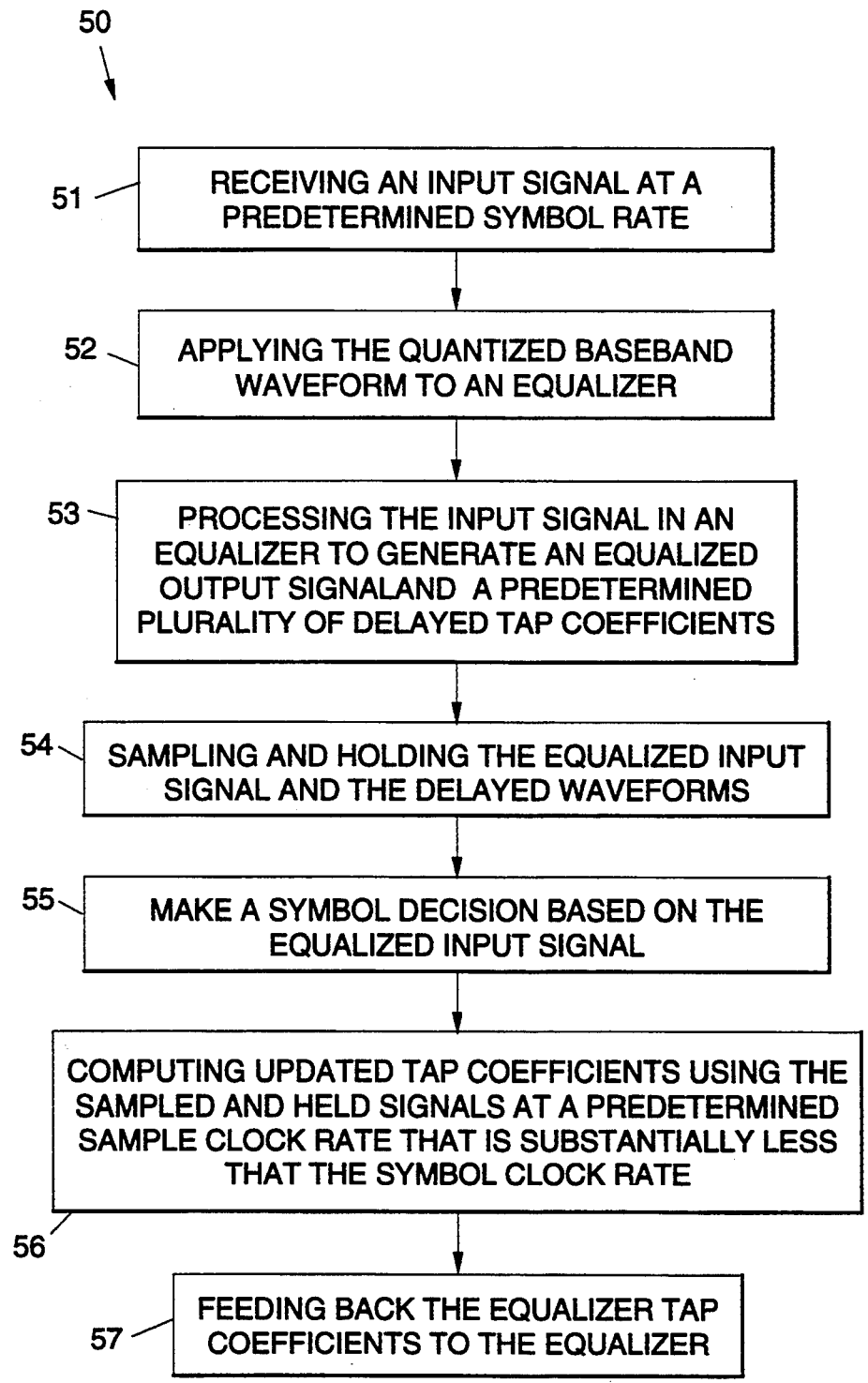
FIGS. 8–10 illustrate three processing methods in accordance with the principles of the present invention.
Figure 9:
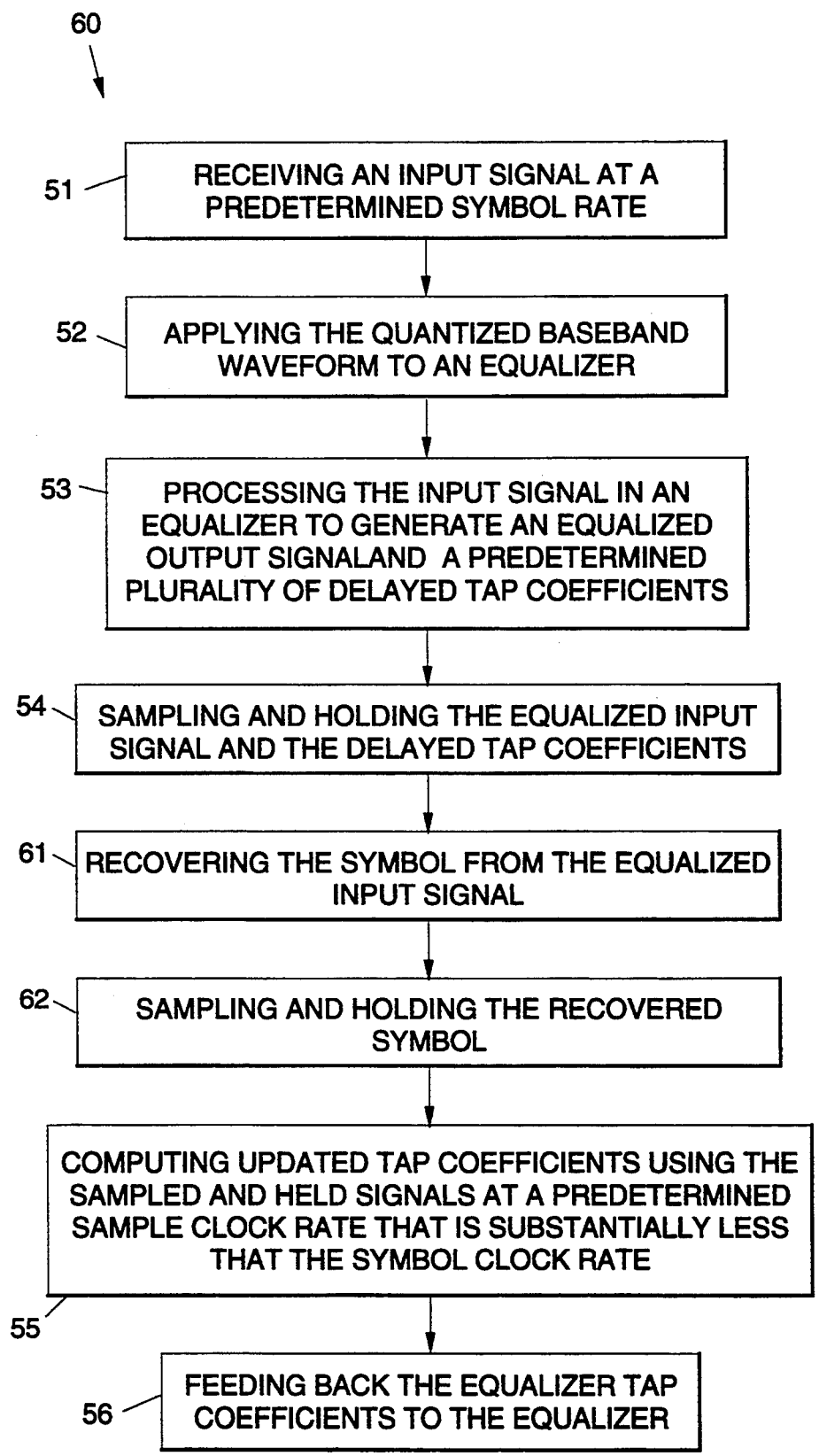
Figure 10:
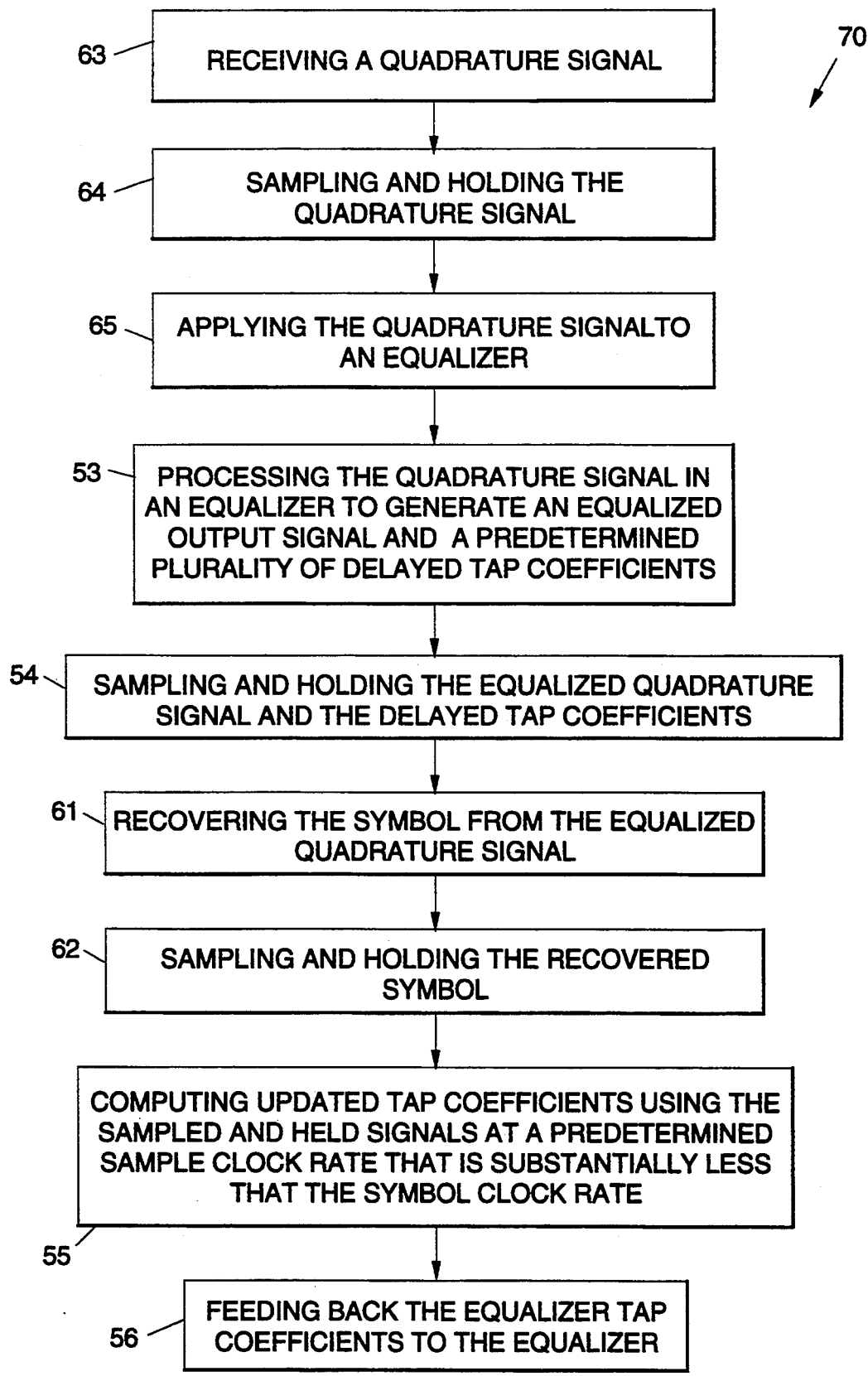

Given the above, FIGS. 8-10 are flow diagrams illustrating three processing methods 50, 60, 70 in accordance with the principles of the present invention. In the first method 50 shown in FIG. 8, the first step is to receive a quantized baseband waveform, indicated in step 51. The quantized baseband waveform is then applied to a digital equalizer, indicated in step 52. The digital equalizer then produces an equalized baseband waveform and delayed waveforms which are generated at a predetermined symbol clock rate, indicated in step 53. The equalized baseband waveform and delayed waveforms are then sampled and held, indicated in step 54. A symbol decision is made based on the equalized input signal, as indicated in step 55. Updated tap coefficients, sample timing errors and symbol clock error signals are then computed using the sampled and held waveforms, and are generated at a predetermined sample clock rate that is substantially less that the symbol clock rate, indicated in step 56. The updated tap coefficients are then fed back to the digital equalizer, indicated in step 57. Thus, in the first method 50, a necessary step in the tap updating process is to make a symbol decision that is based on the information contained in the equalized waveform.

In the second method 60 shown in FIG. 9, the first step is to receive a quantized baseband waveform, indicated in step 51. The quantized baseband waveform is then applied to a digital equalizer, indicated in step 52. The digital equalizer then produces an equalized baseband waveform and delayed waveforms which are generated at a predetermined symbol clock rate, indicated in step 53. The equalized baseband waveform and delayed waveforms are then sampled and held, indicated in step 54. The symbol is recovered from the equalized baseband waveform, as indicated in step 61. The recovered symbol is sampled and held in a symbol register, as indicated in step 62. Updated tap coefficients, sample timing errors and symbol clock error signals are then computed using the sampled and held waveforms, and the sampled and held symbol, and are generated at a predetermined sample clock rate that is substantially less that the symbol clock rate, indicated in step 55. The updated tap coefficients are then fed back to the digital equalizer, indicated in step 56.

In the third method 70 shown in FIG. 10, the first step is to receive a quadrature signal, indicated in step 64. The quadrature signal is then sampled and held, indicated in step 65. The quadrature signal is then applied to an analog equalizer, indicated in step 66. The analog equalizer then produces an equalized baseband waveform and delayed waveforms (tap coefficients) which are generated at a predetermined symbol clock rate, indicated in step 53. The equalized quadrature signal and delayed waveforms are then sampled and held, indicated in step 54. The symbol is recovered from the equalized quadrature signal, as indicated in step 61. The recovered symbol is sampled and held in a symbol register, as indicated in step 62. Updated tap coefficients, sample timing errors and symbol clock error signals are then computed using the sampled and held waveforms, and the sampled and held symbol, and are generated at a predetermined sample clock rate that is substantially less that the symbol clock rate, indicated in step 55. The updated tap coefficients are then fed back to the analog equalizer, indicated in step 56.

Thus there has been described new and improved adaptive equalizers and processing methods that provide for adaptive equalization at very high data symbol rates. It is to be understood that the above-described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A processing method that provides for adaptive equalization of a quantized baseband waveform, said method comprising the steps of:
   receiving a quantized baseband waveform;
   applying the quantized baseband waveform to an equalizer;
   producing an equalized baseband waveform that are generated at a predetermined symbol clock rate;
   sampling and holding as many successive baseband samples as there are taps in the equalizer to generate sampled and held waveforms and sampling the equalized baseband waveform;
   computing updated tap coefficients using the sampled and held waveforms at a predetermined sample clock rate that is substantially less that the symbol clock rate; and
   feeding back the updated tap coefficients to the equalizer.

2. The processing method of claim 1 wherein prior to computing the updated tap coefficients, the method further comprises the steps of:
   recovering a symbol from the equalized baseband waveform to provide a recovered symbol; and
   sampling and holding the recovered symbol for use in computing the updated tap coefficients.

3. The processing method of claim 1 wherein the computing and feeding back steps comprise the steps of:
   computing updated tap coefficients using the sampled and held waveforms, sample timing errors, and symbol clock error signals at a predetermined sample clock rate that is substantially less that the symbol clock rate;
   feeding back the updated tap coefficients to the equalizer; and
   feeding back the symbol clock error signals to control timing of a symbol clock.

4. The processing method of claim 1 wherein the equalizer comprises an analog equalizer and wherein the method further comprise the steps of:
   receiving a quadrature signal;
   sampling and holding the quadrature signal; and
   applying the quadrature signal to the analog equalizer.

5. An adaptive equalizer for processing an input signal and producing an equalized output signal, said equalizer comprising:
   an equalizer for receiving the input signal and for producing an equalized output signal and tap coefficients that are generated at a predetermined symbol clock rate;
   a digital processor coupled to the equalizer that comprises sample and hold registers for sampling and holding the equalized output signal and tap coefficients, for computing updated tap coefficients using the sampled and held output signal and N successive baseband samples at a predetermined sample clock rate that is substantially less that a symbol clock rate, and for feeding back the updated tap coefficients to the equalizer.

6. The adaptive equalizer of claim 5 further comprising:
   a symbol recovery circuit coupled to the equalizer for recovering a symbol from the equalized output signal; and
   a symbol register disposed in the digital processor for sampling and holding the recovered symbol for use in computing the updated tap coefficients.

7. The adaptive equalizer of claim 5 wherein the digital processor computes updated tap coefficients using the sampled and held output signals, sample timing errors, and symbol clock error signals at the predetermined sample clock rate that is substantially less that a symbol clock rate, feeds back the updated tap coefficients to the equalizer, and feeds back the symbol clock error signals to control timing of a symbol clock.

8. The adaptive equalizer of claim 5 wherein the equalizer comprises an analog equalizer and wherein the input signal comprises a quadrature signal and wherein the equalizer further comprises, means for sampling and holding the quadrature signal coupled to an input of the analog equalizer.

* * * * *